US008392805B2

(12) United States Patent
Wylie et al.

(10) Patent No.: US 8,392,805 B2
(45) Date of Patent: Mar. 5, 2013

(54) NON-MDS ERASURE CODES FOR STORAGE SYSTEMS

(75) Inventors: John Johnson Wylie, San Francisco, CA (US); Xiaozhou Li, Cupertino, CA (US)

(73) Assignee: Hewlett-Packard Development Company, L. P., Houston, TX (US)

( * ) Notice: Subject to any disclaimer, the term of this patent is extended or adjusted under 35 U.S.C. 154(b) by 357 days.

(21) Appl. No.: 12/837,085

(22) Filed: Jul. 15, 2010

(65) Prior Publication Data

US 2012/0017140 A1 Jan. 19, 2012

(51) Int. Cl.
*G11C 29/00* (2006.01)
*H03M 13/00* (2006.01)

(52) U.S. Cl. ........ 714/777; 714/767; 714/766; 714/770; 714/772; 714/784

(58) Field of Classification Search ........................ None
See application file for complete search history.

(56) References Cited

U.S. PATENT DOCUMENTS 7,254,754 B2 8/2007 Hetzler et al.
7,321,905 B2 1/2008 Hartline et al.
7,533,325 B2 5/2009 Hetzler et al.
8,127,212 B2 * 2/2012 Wylie et al. .................. 714/785
8,145,941 B2 * 3/2012 Jacobson ..................... 714/6.24
2009/0028448 A1 * 1/2009 Collomosse et al. ......... 382/232
2009/0083590 A1 * 3/2009 Wylie et al. .................. 714/703
2009/0164762 A1 6/2009 Huang et al.
2009/0313499 A1 * 12/2009 Deenadhayalan et al. ........ 714/6
2010/0083074 A1 * 4/2010 Wang et al. .................. 714/777

OTHER PUBLICATIONS

Dan Tang, et al., A New Class of Highly Fault Tolerant Erasure Code for the Disk Array, http://ieeexplore.ieee.org/xpl/freeabs_all.jsp?reload=true&arnumber=4634921, Publication Date: Aug. 2-3, 2008, pp. 578-581.

* cited by examiner

*Primary Examiner* — Guerrier Merant

(57) ABSTRACT

Erasure-encoded data is stored across a plurality of storage devices in a data storage system. The erasure-encoded data includes k data elements to store on k data storage devices and m parity elements to store on m parity storage devices, wherein for a given minimum Hamming distance d of the data storage system and $m \geqq (d-1)$, data elements are assigned only to corresponding unique combinations of parity elements of size $(d-1)$.

19 Claims, 5 Drawing Sheets

100
102 HOST 120 M CPU 114
104 HOST 122 M CPU 116
106 HOST 124 M CPU 118
101
STORAGE 108
STORAGE 110
STORAGE 112

FIG. 5
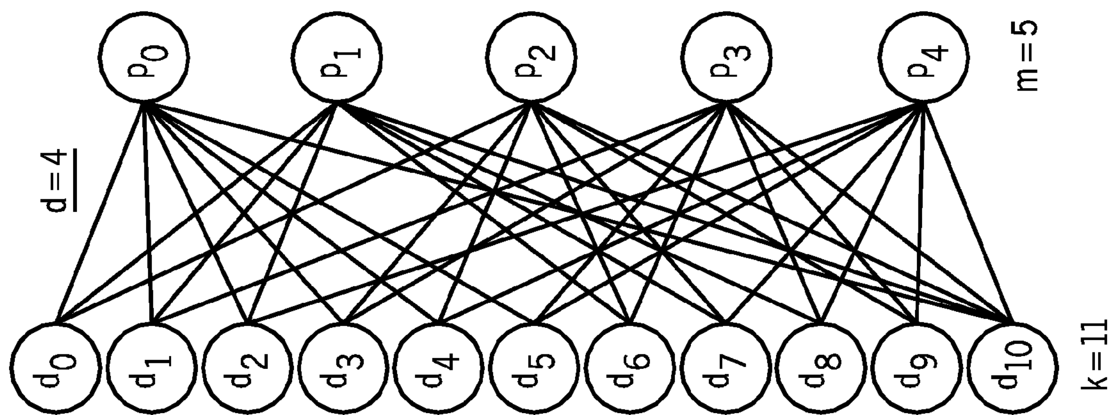
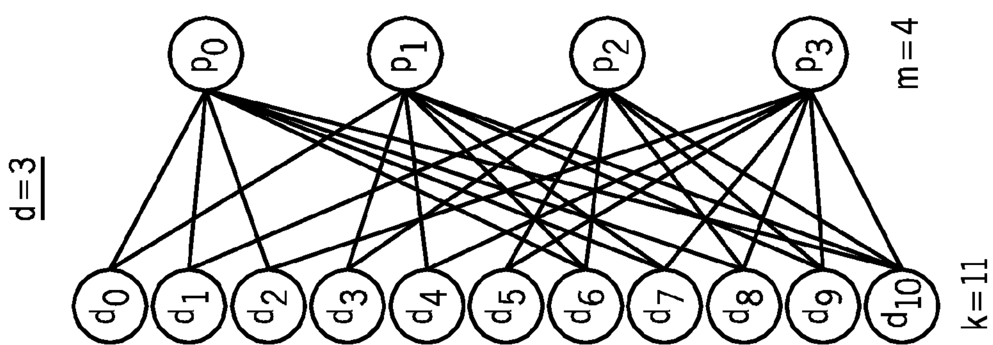
FIG. 4

NON-MDS ERASURE CODES FOR STORAGE SYSTEMS

BACKGROUND

Storage systems need to reliably handle and store data and, thus, typically implement some type of scheme for recovering data that has been lost, degraded or otherwise compromised. At the most basic level, one recovery scheme could simply involve creating one or more complete copies or mirrors of the data being transferred or stored. Although such a recovery scheme may be relatively fault tolerant, it is not very efficient with respect to the need to duplicate storage space. Other recovery schemes involve performing a parity check. Thus, for instance, in a storage system having stored data distributed across multiple disks, one disk may be used solely for storing parity bits. While this type of recovery scheme requires less storage space than a mirroring scheme, it is not as fault tolerant, since any two device failures would result in an inability to recover any compromised data.

Thus, various recovery schemes have been developed with the goal of increasing efficiency (in terms of the amount of extra data generated) and fault tolerance (i.e., the extent to which the scheme can recover compromised data). These recovery schemes generally involve the creation of erasure codes that are adapted to generate and embed data redundancies within original data packets, thereby encoding the data packets in a prescribed manner. If such data packets become compromised, as may result from a disk or sector failure, for instance, such redundancies could enable recovery of the compromised data, or at least portions thereof. Various types of erasure codes are known, such as Reed-Solomon codes, RAID variants, array codes (e.g., EVENODD, RDP, etc.) and XOR-based erasure codes. However, encoding or decoding operations of such erasure codes often are computationally demanding, which, though often useful in communication network systems, render their implementation cumbersome in storage systems.

BRIEF DESCRIPTION OF THE DRAWINGS

Some embodiments are described with respect to the following figures:

FIG. 4 is a Tanner graph of yet another exemplary erasure code constructed in accordance with an embodiment.

FIG. 5 is a Tanner graph of a further exemplary erasure code constructed in accordance with an embodiment.

DETAILED DESCRIPTION

Figure 1:
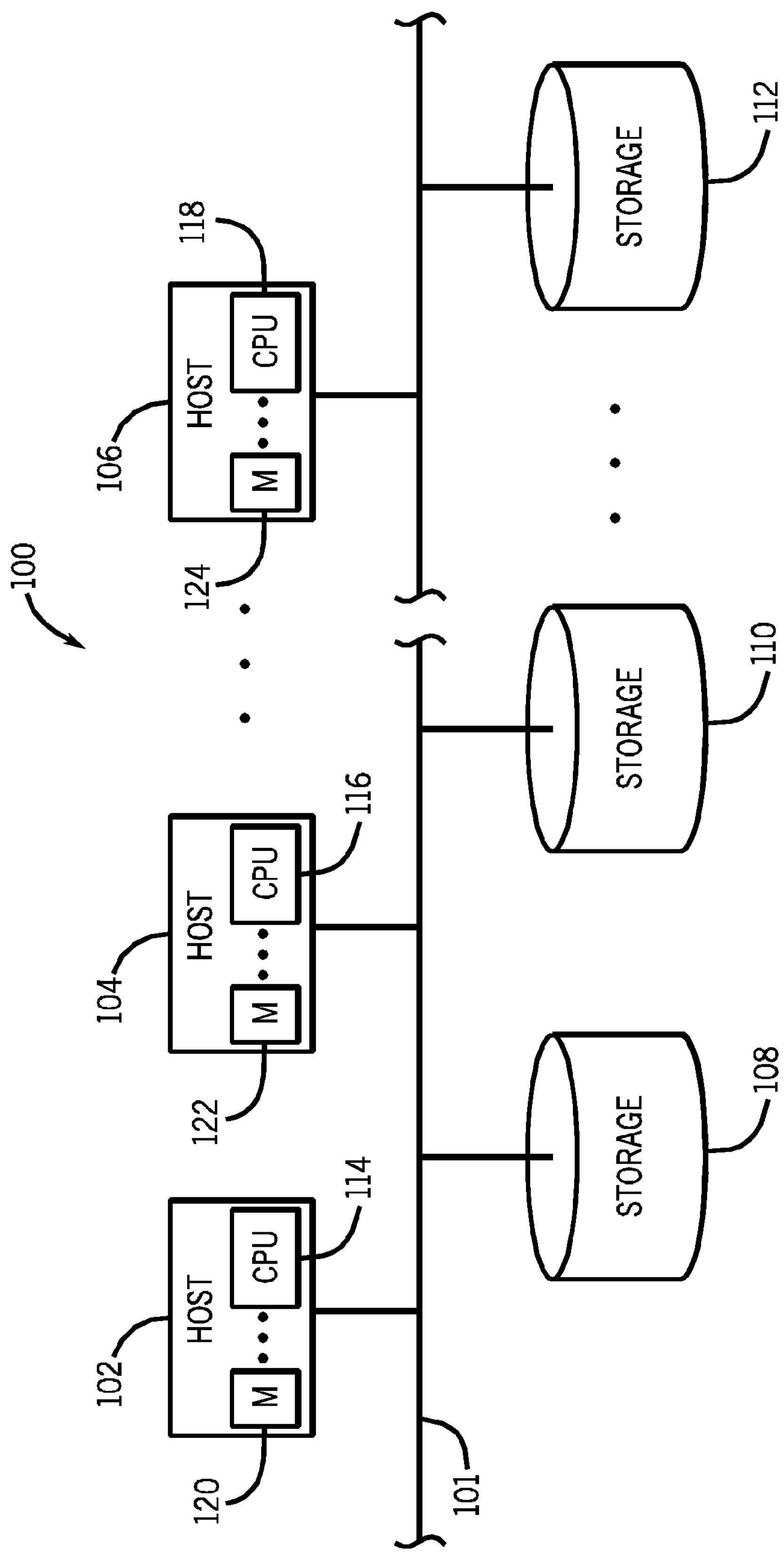
FIG. 1 is a block diagram of an exemplary storage system in which exemplary erasure codes constructed in accordance with embodiments may be implemented.

Erasure codes, such as replication, RAID 5, and other Reed-Solomon codes, are traditional means by which storage systems may be made reliable. Such codes are Maximum Distance Separable (MDS) codes. An MDS code is an erasure code that offers optimal space-efficiency for a given fault tolerance. That is, each additional storage disk of redundancy allows the storage system to tolerate an additional disk (or sector) failure. Traditionally, single-disk fault tolerant codes, such as two-way replication and RAID 5, have been able to protect most data stored on disk in storage systems. However, as disk size increases, sector failures on available disks place stored data at risk in the event of a single-disk failure. As large-scale data systems, such as big data, archival and cloud storage systems, become more prevalent, an increasing number of storage systems exist that are comprised of very large populations of storage disks. The commodity-based architecture of these large systems leads to higher disk failure rates. Accordingly, traditional MDS single-disk fault tolerant erasure codes may no longer adequately protect data in many storage systems.

In contrast to MDS codes, non-MDS codes require a larger number of redundant disks than would otherwise be strictly necessary to tolerate the desired number of faults and, thus, are less space-efficient. Examples of non-MDS codes which have been used in storage systems include RAID 10, RAID 50 and RAID 60 codes. These codes tradeoff space efficiency for reduced computation costs in terms of encoding/decoding operations. Other non-MDS codes that have low computation costs, such as low-density parity-check (LDPC) codes, have been used in networked and communication systems (e.g., content streaming networks). LDPC codes have an asymptotic property in that they are large erasure codes (i.e., require a large number of symbols) that sacrifice a relatively small amount of space-efficiency to significantly reduce the computation costs required to encode and decode the data over lossy communication channels. Networked systems generally can take advantage of the asymptotic nature of LDPC codes to great effect.

Data storage systems, however, have not taken advantage of LDPC codes for several reasons. First, storage systems typically use only systematic codes, which are erasure codes in which the stored data is striped across the storage disks. This characteristic allows single strips to be read from individual disks, or the stripe to be read in its entirety, without any decoding. LDPC codes are not systematic. Second, although data storage systems continue to grow in size, storage systems cannot take advantage of the asymptotic characteristic of LDPC codes because any specific stored object is striped over a relatively small number of disks (e.g., eight to thirty disks) while LDPC codes typically would need to distribute encoded symbols across hundreds or thousands of disks to achieve their intended properties. Since a data storage system generally would not perform well if hundreds of disks would need to be accessed each time an object is stored or retrieved, the use of an LDPC code would not be practical.

The need to store objects over a relatively small number of storage disks leads to the third reason that LDPC codes are not used for storage systems. LDPC codes are large (i.e., have a large number of elements). Construction of the LDPC codes incorporates probabilistic techniques that require large numbers to work properly. As a result, construction techniques for small LDPC codes are not well-understood.

By way of background, erasure codes are made up of n elements (or symbols), k of which are data elements, and m of which are redundant (or parity) elements. One type of non-MDS erasure code is an XOR code. The elements of an XOR code are defined by equations that are an XOR of interconnected elements. Because the XOR operation is relatively simple to compute, XOR codes are low-weight codes in that they have a light computation cost.

The fault tolerance of an erasure code is defined by its Hamming distance, d. An erasure code of Hamming distance, d, tolerates all failures of fewer than d elements (either data or parity elements). In storage systems, erasure codes are often described as being one-, two-, or three-disk fault tolerant. These fault tolerances respectively correspond to Hamming distances of 2, 3 and 4.

Low-density parity-check (LDPC) codes are non-MDS, XOR erasure codes. A concise way of describing an LDPC code is with a Tanner graph, which is a bipartite graph with data elements on one side and parity elements on the other side. The data and parity elements are interconnected by edges. A parity element is calculated by XORing each data element to which it is connected by an edge. Similarly, a data element is calculated by XORing any parity element to which it is connected with the other data elements to which the parity is connected. Examples of Tanner graphs are shown in FIGS. 2-5.

When k (the number of data elements) is very large, LDPC codes can achieve a space efficiency for a given fault tolerance that approximates that of MDS codes, but with a significantly lower computational complexity for both encoding and decoding operations. In storage systems, however, these asymptotic properties do not apply since k tends not to be sufficiently large. Thus, LDPC codes, while providing multiple disk fault tolerance, are not particularly suited for storage systems since k for storage system tends to be relatively small (e.g., eight to thirty data elements)

Accordingly, embodiments of the invention are directed toward constructing small non-MDS, erasure codes that trade off some space efficiency yet provide multiple disk fault tolerance at a low computational cost. In illustrative embodiments of the construction techniques described herein, such non-MDS codes are referred to as Minimum Distance (MD) Combination codes and Stepped Combination codes. In the embodiments described herein, the constructions of such erasure codes are valid for two- and three-disk fault tolerant storage systems.

The MD Combination code is a subset of the Stepped Combination code. In accordance with embodiments of the invention, the MD Combination code is an XOR code in which every data element is assigned (i.e., connected) to only the minimum number of parity elements to ensure the desired fault tolerance for the storage system can be achieved. For instance, to ensure a two-disk fault tolerant system, each data element must be assigned (or connected) to at least two parity elements. Because the MD Combination code requires the minimum number of connections, for a two-disk fault tolerant system, an MD Combination code construction interconnects the data elements to unique combinations of only two parity elements (i.e., combinations of size two). Similarly, a three-disk fault tolerant MD Combination code construction connects the data elements to unique combinations of only three parity elements (i.e., combinations of size three).

Because of the minimum interconnection rule for the MD Combination code construction, only a limited number (k) of data disks can be supported for a given number (m) of parity disks. That is, the number of data disks is limited by the maximum possible number of unique combinations of parity disks of size (d−1). As an example, for a two-disk fault tolerant system (i.e., d=3), which has four parity disks (i.e., m=4), there are only six possible unique combinations of parity disks of size two (i.e., d−1). To illustrate, if the four parity elements are p0, p1, p2, p3, then the six unique combinations of size two are: (p0,p1), (p0,p2), (p0,p3), (p1,p2), (p1,p3), and (p2,p3). Thus, only six data disks can be supported to ensure that the system is two-disk fault tolerant. Similarly, for a three-disk fault tolerant system (i.e., d=4), which has four parity disks, there are only four possible unique combinations of parity disks of size three. Thus, only four data disks can be supported to ensure that the system is three-disk fault tolerant.

In accordance with exemplary embodiments, the construction of an MD Combination code for a two-disk fault tolerant system (i.e, d=3) having m parity disks, and k data disks is valid within the following bounds:

$$(m-1)(m-2)/2<k\leqq m(m-1)/2;\text{ and}$$

$$m\geqq d-1=2$$

Figure 2:
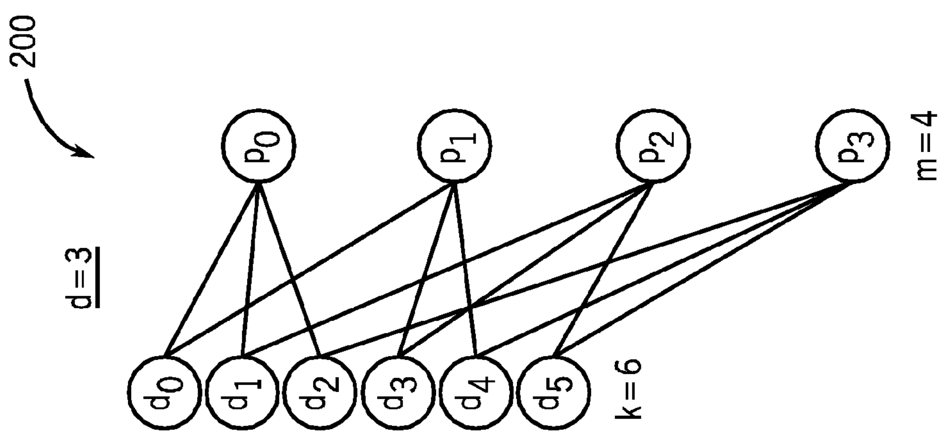
FIG. 2 is a Tanner graph of an exemplary erasure code constructed in accordance with an embodiment.

Thus, for d=3, and m=4, the number of data disks that optimally are supported ranges from a minimum of four data disks (for space efficiency, i.e., any fewer data disks would not require m=4 parity disks) to a maximum of six (to satisfy the low-computation weight, minimum distance constraint). A d=3, m=4 MD Combination code construction for k=6 is represented by the Tanner graph 200 in FIG. 2. As can be seen in FIG. 2, each of the six data disks d0-d5 are connected only to a unique combination of parity disks of size two (i.e., d−1), and all unique combinations of size two are used. As an example, data disk d0 is connected only to a combination of two parity disks (p0,p1).

Similarly, the construction of an MD Combination code for a three-disk fault tolerant system (i.e, d=4) having m parity disks, and k data disks is valid within the following bounds:

$$(m-1)(m-2)(m-3)/6<k\leqq m(m-1)(m-2)/6;\text{ and}$$

$$m\geqq d-1=3$$

Figure 3:
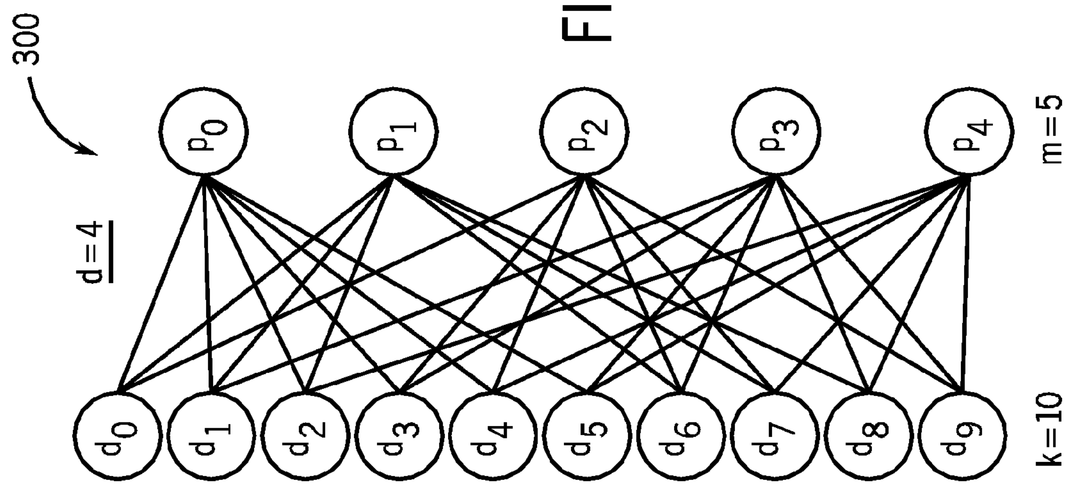
FIG. 3 is a Tanner graph of another exemplary erasure code constructed in accordance with an embodiment.

Thus, for d=4 and m=5, the number of data disks that optimally are supported ranges from a minimum of five data disks to a maximum of ten data disks. A d=4, m=5, MD Combination code construction for k=10 is represented by the Tanner graph 300 in FIG. 3. As can be seen in FIG. 3, each of the ten data disks d0-d9 are connected only to a unique combination of parity disks of size three (i.e., d−1), and all unique combinations of size three are used. As an example, data disk d0 is connected only to the combination of (p0,p1,p2).

The MD Combination code is limited by the number of data elements that it can support. However, since an MD Combination code connects each data element to only the minimum number of parity elements, the code is a low weight code in that only a minimum number of parity elements need updating any time a data element is stored or retrieved. In addition, recovery of data and parity elements is relatively straightforward since short recovery equations are well known due to the construction.

More particularly, short recovery equations for an MD Combination code can be readily determined from the Tanner graph corresponding to the code. Although other recovery equations may exist, the equations that are defined by the edges of the code's corresponding Tanner graph provide for a set of well-known, short equations. For instance, with reference to FIG. 2, two recovery equations of size three (i.e., that consist of three elements) for recovering data element d0 are defined by the Tanner graph 200: (1) the XOR of p0, d1 and d2; and (2) the XOR of p1, d3 and d4. As another example, the Tanner graph 200 also defines one recovery equation of size three that can be used to recover parity element p0: the XOR of d0, d1 and d2.

As can be seen from the Tanner graph 200 in FIG. 2, all data elements have at least two known recovery equations and all parity elements have at least one known recovery equation. Because there is at least one known recovery equation for each element of the code, the computational cost associated with the MD Combination code is reduced since the known equations can be readily stored for later lookup rather than calculated when needed. This feature allows for efficient and quick recovery and renders the MD Combination codes particularly useful in parallel recovery schemes (i.e., schemes in which multiple elements are concurrently recovered).

Stepped Combination codes are a superset of the MD Combination codes. As explained above, MD Combination codes are limited in the number of data elements they can support. However, this limitation is offset by the MD Combination code's low code weight (i.e., the computational cost associated with encoding and decoding operations) since each data element is connected only to the minimum number of parity elements. In storage systems in which more data elements are needed or desired, better space efficiencies may be achieved by sacrificing code weight. Thus, in some embodiments, a Stepped Combination code can be constructed for a desired level of fault tolerance that is more space efficient than its MD Combination code counterpart by allowing data elements to connect to more than the minimum number of parity elements. However, the tradeoff for the Stepped Combination code is an increased code weight.

As an example, for the two-disk fault tolerant system (i.e., d=3) having four parity disks (m=4) discussed above, the MD Combination code supports only six data disks (k=6). However, if data disks can connect to more than unique combinations of the minimum number of parity elements (i.e., size (d−1)), then additional data disks can be supported, which leads to the construction of a Stepped Combination code. In general, to construct a Stepped Combination code, for a given fault tolerance, (d−1), all unique combinations of parity elements that are of size (d−1) are considered, then all combinations of parity elements that are of size d, and so on, up until the one combination of all m parity elements. Thus, for instance, for a two-disk fault tolerant system (i.e., d=3), for a given value of m, the unique combinations of parity disks of size two (i.e., d−1) are considered and a unique combination is assigned to an available data disk. If, after assigning all unique combinations of size two, data disks remain that do not have an assigned parity disk, then the unique combinations of parity disks of size three (i.e., d) are considered and assigned to remaining data disks. If data disks still remain, then the unique combinations of parity disks of size four (i.e., d+1) are considered. This process may continue until an available data disk is assigned to a combination of all (i.e., m) parity disks. From this process, it can be seen that an upper limit again is imposed on the number of data disks that can be protected. However, for a given d and m, the Stepped Combination code provides more space efficiency (i.e., protects a greater number of data disks) for a given number of parity disks than the MD Combination code.

For d=3 (two-disk fault tolerant systems), Stepped Combination code constructions are valid within the following bounds:

$$2^{(m-1)}-m<k\leqq 2^{m}-m-1; \text{ and}$$

$$m\geqq d-1=2$$

Thus, for d=3, m=4, the number of data disks that can be optimally supported by four parity disks ranges from a minimum of five to a maximum of eleven. A d=3, m=4 Stepped Combination code construction for k=11 is represented by the Tanner graph 400 in FIG. 4. As can be seen in FIG. 4, each of the six data disks d0-d5 are connected in the same manner as in the MD Combination code construction of FIG. 2. The code then steps up the combination size, meaning that data disks d6-d9 are connected to the four unique combinations of parity elements of size three (i.e., d). A further step in combination size is taken to connect the last data element d10 to the combination of all parity elements (i.e., size m). From this example, it can be seen that, for Stepped Combination codes, unique combinations of parity elements of incrementally stepped-up size are considered from size d−1 up to and including size m (i.e., the case in which a data disk is assigned to the combination of all parity disks).

Stepped Combination codes that are three-disk tolerant are constructed in a similar manner as two-disk fault tolerant Stepped Combination codes, except that only odd-sized combinations of parity disks are considered. Even-numbered combinations are omitted because, in order to tolerate an odd number of disk failures, combinations from two data elements cannot differ by only one parity element. Otherwise, if the two data elements and the parity element fail, the code is not recoverable. Thus, for d=4, all combinations of three parity disks are considered and assigned to available data disks; then the unique combinations of five parity disks are considered and assigned to remaining data disks; and so on up to the final combination of m (or m−1, if m is even) parity disks. This Stepped Combination code construction is valid for:

$$2^{(m-2)}-m+1<k\leqq 2^{(m-1)}-m; \text{ and}$$

$$m\geqq d-1=3$$

Thus, for d=4, m=5, the number of data disks that can be optimally supported by five parity disks ranges from a minimum of five to a maximum of eleven. A d=4, m=5 Stepped Combination code construction for k=11 is represented by the Tanner graph 500 in FIG. 5. As can be seen in FIG. 5, each of the ten data disks d0-d9 are connected in the same manner as in the counterpart MD Combination code construction for d=4, m=5 configuration of FIG. 3. By using the Stepped Combination code, an additional data element d10 can be supported since the next combination of parity disks of odd size (i.e., size five) can be considered. Since this combination results in data disk d10 being assigned to all parity disks, no further combinations of parity disks exist and no further data disks can be protected by the Stepped Combination code.

As with the MD Combination codes, a set of recovery equations for Stepped Combination codes are well-known from the construction, thus facilitating recovery schemes, although at a slightly higher computational cost. Again, the known recovery equations can be readily stored for later lookup when needed for recovery operations.

Figure 6:
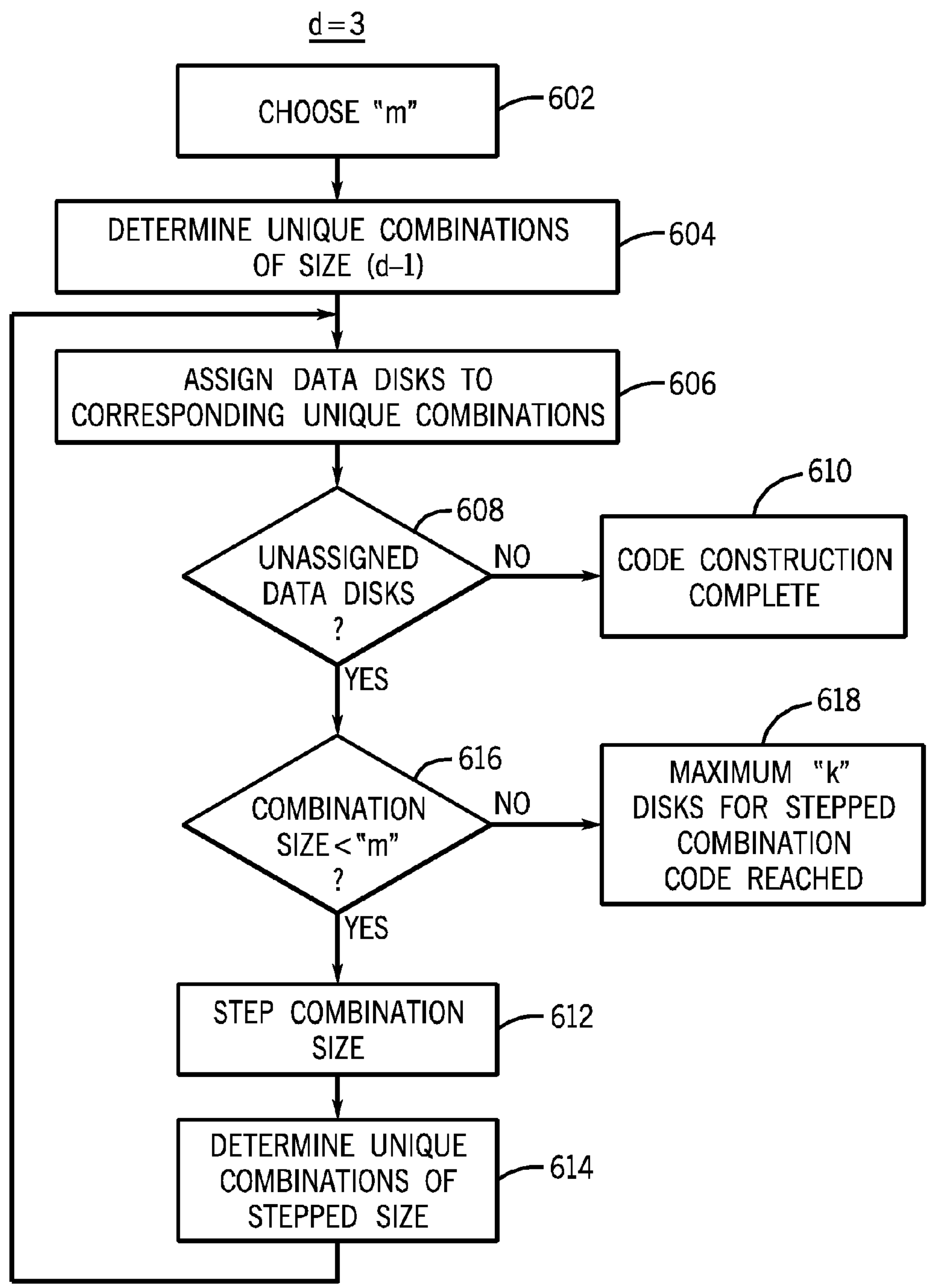
FIG. 6 is a flow diagram of an exemplary construction technique to construct an erasure code in accordance with an embodiment.

A flow diagram of exemplary construction techniques for MD and Stepped Combination codes for a two-disk fault tolerant system is illustrated in FIG. 6. For d=3, a value for m (i.e., the number of parity disks) is selected that is equal to or greater than (d−1) (block 602). The unique combinations of parity disks of size (d−1) are determined (block 604), and data disks are assigned to corresponding unique combinations (block 606). If no data disks remain after this assignment (diamond 608), then the construction technique ends (block 610). At this point, if the combination size is (d−1), then an MD Combination code has been constructed. Otherwise (i.e., the combination size is greater than (d−1)), a Stepped Combination code has been constructed.

If support for further data disks is desired (diamond 608), construction of a Stepped Combination code is initiated (or continued) by stepping up the combination size (e.g., incrementing from (d−1) to d) (block 612) and determining the unique combinations of parity disks of the stepped size (block 614). Available data disks are then assigned to corresponding ones of these unique combinations (block 606). If data disks are still available (diamond 608) and the stepped combination size is less than m (i.e., the total number of parity disks) (diamond 616), then the combination size is again stepped (block 612). This process continues until the process determines that a data disk has been assigned to the combination of parity disks of size m (diamond 616), indicating that the maximum number, k, of data disks that can be supported by the constructed Stepped Combination code to achieve the desired fault tolerance (d−1) has been reached (block 618).

Figure 7:
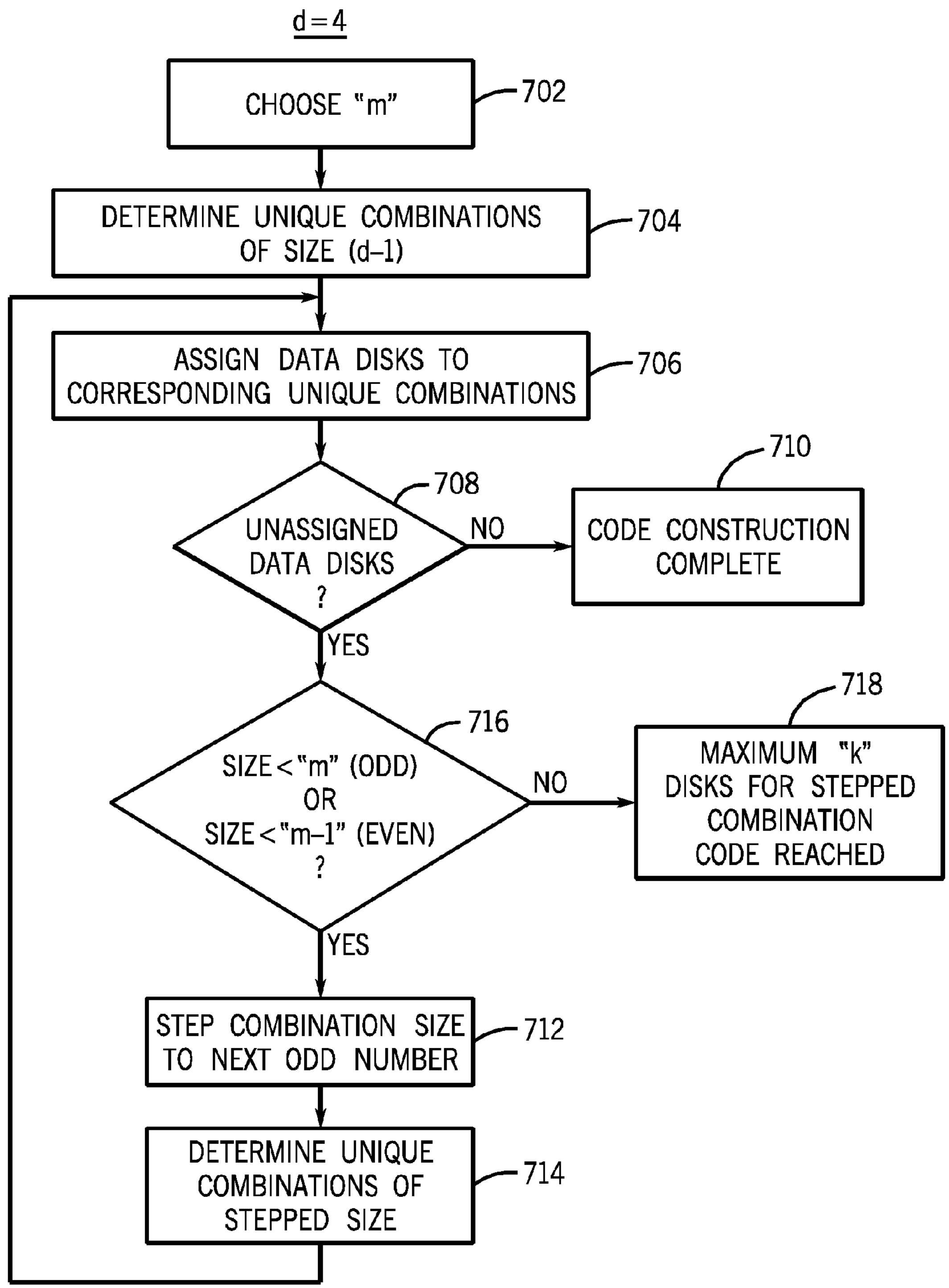
FIG. 7 is a flow diagram of another exemplary construction technique to construct an erasure code in accordance with an embodiment.

FIG. 7 illustrates a similar flow diagram for a three-disk fault tolerant system (d=4). At block 702, the number of parity disks, m, is selected so that m is equal to or greater than d. The unique combinations of parity disks of size d−1 are considered (block 704) and available data disks are assigned to corresponding unique combinations (block 706). If all available disks are assigned to a unique combination (diamond 708), then the construction technique ends (block 710). Again, an MD Combination code has been constructed if the combination size is (d−1). Otherwise, a Stepped Combination code has been constructed.

If support for further data disks is desired (diamond 708), then the construction technique continues by considering only odd-sized combinations. Thus, the combination size is incremented to the next odd size (e.g., d+1) (block 712), the unique combinations of parity elements of the stepped odd size are determined (block 714) and available data disks are assigned to corresponding odd-sized combinations (block 706). If data disks remain (diamond 708), and the previous combination size was less than m (for an odd m) or m−1 (for an even m) (diamond 716), then the combination size again is incremented by two steps (i.e., to the next odd size) (block 712). This process continues until a combination of m (or m−1) parity disks is assigned to an available data disk (diamond 716), indicating that the maximum number, k, of data disks that can be supported by the constructed Stepped Combination code has been reached (block 718).

It should be understood that the flow diagrams shown in FIGS. 6 and 7 are exemplary only and that the construction techniques illustrated may include fewer, additional or different steps, and the steps may be performed in orders other than those illustrated in FIGS. 6 and 7.

Although the foregoing descriptions of the MD and Stepped Combination code construction techniques have solved for the maximum number (k) of data disks that can be supported for a given fault tolerance (d−1) and number (m) of parity disks, the same principles can be applied to determine the minimum number of parity disks that are needed to support a given fault tolerance in a storage system in which protection for given number of data disks, k, is desired. For space efficiency, the minimum number, m, of parity disks that can support the desired number, k, of data disks for the given fault tolerance, (d−1), can be selected.

FIG. 1 illustrates an exemplary arrangement of a system of devices 100, which includes a plurality of computer hosts 102, 104, 106, and a plurality of storage devices 108, 110, 112. In one embodiment, the hosts 102, 104, 106 and storage devices 108, 110, 112 may be interconnected by a network 101. The network 101 may include, for example, a local area network (LAN), a wide area network (WAN), a storage area network (SAN), the Internet, or any other type of communication link or combination of links. In addition, the network 101 may include system busses or other fast interconnects. The system 100 shown in FIG. 1 may be any one of an application server farm, a storage server farm (or storage area network), a web server farm, a switch or router farm, etc. Although three hosts 102, 104, 106 and three storage devices 108, 110, 112 are depicted in FIG. 1, it is understood that the system 100 may include more or less than three hosts and three storage devices, depending on the particular application in which the system 100 is employed. The hosts may be, for example, computers (e.g., application servers, storage servers, web servers, etc.), communication modules (e.g., switches, routers, etc.) and other types of machines. Although each of the hosts is depicted in FIG. 1 as being contained within a box, a particular host may be a distributed machine, which has multiple nodes that provide a distributed and parallel processing system. Further, each of the hosts 102-106 may include one or multiple CPUs 114, 116, 118, such as a microprocessor, microcontroller, etc., and one or multiple memories 120, 122, 124 for storing various applications and data, for instance.

The storage devices 108-112 are adapted to store data associated with the hosts 102-106. Each of the hosts 102-106 could be coupled to one or more storage devices 108-112, and each of the hosts 102-106 could access the storage devices 108-112 for storing and/or retrieving data from those devices. Each of the storage devices 108-112 could be an independent memory bank. Alternatively, the devices 108-112 could be interconnected, thus forming a large memory bank or a subcomplex of a large memory bank. The devices 108-112 may be, for example, storage disks, magnetic memory devices, optical memory devices, flash memory devices, combinations thereof, etc., depending on the particular implementation of the system 100 in which the devices are employed. In some embodiments, each storage device 108-112 may include multiple storage disks, magnetic memory devices, optical memory devices, flash memory devices, etc.

In an exemplary embodiment, the MD Combination codes and the Stepped Combination codes can be implemented across the plurality of hosts 102-106 and/or the plurality of storage devices 108-112 to recover data that has become damaged, lost, or otherwise compromised during transferring, storing, and/or retrieving operations implemented by the hosts 102-106 and/or the storage devices 108-112. For instance, the data and parity elements corresponding to an erasure coded data object may be stored as a stripe across the storage devices 108-112. In some embodiments, encoding and decoding operations to construct and recover the MD Combination and Stepped Combination encoded elements for a data object may be performed by the hosts 102-106. For instance, instructions of software that correspond to any of the techniques described herein, including the construction techniques described with reference to FIGS. 6 and 7, can be loaded for execution on a processor (such as any or multiple of CPUs 114, 116, 118 in FIG. 1). A processor can include a microprocessor, microcontroller, processor module or subsystem, programmable integrated circuit, programmable gate array, or another control or computing device. As used here, a “processor” can refer to a single component or to plural components (e.g., one CPU or multiple CPUs).

Data and instructions are stored in respective storage devices (e.g., memories 120, 122, 124 in FIG. 1), which are implemented as one or more computer-readable or machine-readable storage media. For instance, in addition to instructions of software, CPUs 114, 116, 118 can access data stored in memories 120, 122, 124 to perform encoding and decoding operations. For instance, recovery equations corresponding to encoded data objects stored across the storage devices 108, 110, 112 may be maintained in lookup tables in memories 120, 122, 124. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A data storage system, comprising:

an interconnect; and a plurality of storage devices coupled by the interconnect, the storage devices including data storage devices and parity storage devices to store erasure-encoded data, the erasure-encoded data including k data elements to store on k data storage devices and m parity elements to store on m parity storage devices, wherein for a given minimum Hamming Distance d of the data storage system and $m>(d-1)$, at least a subset of the data elements are assigned only to corresponding unique combinations of parity elements of size $(d-1)$, where $d>2$ and $k>m$.

2. A data storage system, comprising:

an interconnect; and a plurality of storage devices coupled by the interconnect, the storage devices including data storage devices and parity storage devices to store erasure-encoded data, the erasure-encoded data including k data elements to store on k data storage devices and m parity elements to store on m parity storage devices, wherein for a given minimum Hamming Distance d of the data storage system and $m \geqq (d-1)$, data elements are assigned only to corresponding unique combinations of parity elements of size $(d-1)$, where $d>1$ and $k>1$, wherein, if data elements remain after all unique combinations of parity elements of size $(d-1)$ are assigned, the remaining data elements are assigned to only corresponding unique combinations of parity elements of an iteratively stepped size.

3. The data storage system as recited in claim 2, wherein the size of the unique combination of parity elements is stepped up until a unique combination of parity elements of size m is assigned to a remaining data element.

4. The data storage system as recited in claim 2, wherein $d=4$, and wherein the size of the unique combination of parity elements is stepped up until a unique combination of parity elements of size $(m-1)$ is assigned to a remaining data element.

5. The data storage system as recited in claim 4, wherein all of the unique combinations of parity elements are of an odd-numbered size.

6. The data storage system as recited in claim 1, further comprising a computer processor coupled to the storage devices, the computer processor to encode data inserted into the data storage system to construct the k data elements and the m parity elements to store on the k data storage devices and the m parity devices, respectively, in accordance with the assignment of data elements to the corresponding unique combinations of parity elements.

7. The data storage system as recited in claim 6, further comprising a memory to store recovery equations corresponding to the k data elements and the m parity elements.

8. The data storage system as recited in claim 1, wherein the interconnect includes a wide area network, and wherein the storage devices are distributed across storage nodes coupled to one another via the wide area network.

9. An article comprising a tangible computer-accessible storage medium containing instructions that, when executed by a computer processing device, cause the computer processing device to:

encode data into a plurality of erasure-encoded elements for storage across a plurality of storage devices in a storage system, the erasure-encoded elements comprising k data elements and m parity elements; and for a given fault tolerance $(d-1)$ for the storage system, and where $m>(d(d-1)$, assign the data elements only to corresponding unique combinations of parity elements of size $(d-1)$ until no unique combinations of parity elements of size $(d-1)$ remain, where $d>2$ and $k \geqq m$.

10. An article comprising a tangible computer-accessible storage medium containing instructions that, when executed by a computer processing device, cause the computer processing device to:

encode data into a plurality of erasure-encoded elements for storage across a plurality of storage devices in a storage system, the erasure-encoded elements comprising k data elements and m parity elements;

for a given fault tolerance $(d-1)$ for the storage system, and where $m \geqq (d-1)$, assign a data element only to a corresponding unique combination of parity elements of size $(d-1)$ until no unique combinations of parity elements of size $(d-1)$ remain, where $d>1$ and $k>1$; and wherein, if unassigned data elements remain, iteratively increase the size of unique combinations of parity elements, and assign the remaining unassigned data elements to corresponding unique combinations of parity elements of increased size.

11. The article as recited in claim 10, wherein, the unassigned data elements are assigned to corresponding unique combinations of parity elements of increased size until a remaining unassigned data element is assigned to a combination of parity elements of size m.

12. The article as recited in claim 10, wherein, if $d=4$, and unassigned data elements remain, the instructions further cause the computer processing device to:

assign the unassigned data elements only to corresponding unique combinations of parity elements of an odd-numbered size until a remaining unassigned data element is assigned to a corresponding combination of the largest possible odd-numbered size.

13. The article as recited in claim 9, wherein the instructions further cause the computer processing device to determine recovery equations for the erasure-encoded elements based on the assignment, and store the recovery equations in a memory.

14. A method of constructing an erasure code for a storage system having a fault tolerance $(d-1)$, a number of data stor age devices k, and a number of parity storage devices m, where d>1, k>1, and $m \geqq (d-1)$, the method comprising:

receiving data for storage in the storage system;

encoding the data into a plurality of k erasure-encoded data elements for storage across the k data storage devices and m erasure-encoded parity elements for storage across the m parity storage devices;

determining unique combinations of parity elements of size (d−1);

assigning data elements only to corresponding unique combinations of parity elements of size (d−1);

storing the data elements and the parity elements across the data storage devices and the parity storage devices in accordance with the assignment;

determining if unassigned data elements remain;

if so, determining unique combinations of parity elements of a stepped up size; and assigning the remaining unassigned data elements to corresponding unique combinations of the stepped up size.

15. The method as recited in claim 14, further comprising: determining unique combinations of parity elements of a continuously stepped up size, and assigning remaining unassigned data elements to corresponding combinations of stepped up size until a data element has been assigned to a combination of parity elements of maximum size.

16. The method as recited in claim 15, wherein the maximum size is m.

17. The method as recited in claim 15, wherein the stepped up size is an odd-numbered size.

18. The method as recited in claim 17, wherein the maximum size is (m−1).

19. The data storage system of claim 1, wherein the data storage devices storing the subset of the data elements are each connected only to corresponding unique combinations of (d−1) parity storage devices.

* * * * *

UNITED STATES PATENT AND TRADEMARK OFFICE

CERTIFICATE OF CORRECTION

PATENT NO. : 8,392,805 B2
APPLICATION NO. : 12/837085
DATED : March 5, 2013
INVENTOR(S) : John Johnson Wylie et al.

It is certified that error appears in the above-identified patent and that said Letters Patent is hereby corrected as shown below:

In the Claims

In column 10, line 22, in Claim 9, delete “m>(d(d-1),” and insert -- m>(d-1), --, therefor.

Signed and Sealed this
Seventeenth Day of September, 2013

Teresa Stanek Rea
*Deputy Director of the United States Patent and Trademark Office*